(12) United States Patent
Wang et al.

(10) Patent No.: US 12,414,300 B2
(45) Date of Patent: Sep. 9, 2025

(54) EMBEDDED SONOS MEMORY AND METHOD OF MAKING THE SAME

(71) Applicant: Shanghai Huahong Grace Semiconductor Manufacturing Corporation, Shanghai (CN)

(72) Inventors: Ning Wang, Shanghai (CN); Kegang Zhang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 550 days.

(21) Appl. No.: 17/888,998

(22) Filed: Aug. 16, 2022

(65) Prior Publication Data

US 2023/0269945 A1 Aug. 24, 2023

(30) Foreign Application Priority Data

Feb. 18, 2022 (CN) .......................... 202210149663.4

(51) Int. Cl.
*H10B 43/35* (2023.01)
*H01L 21/02* (2006.01)
*H01L 21/28* (2006.01)
*H10D 30/01* (2025.01)

(52) U.S. Cl.
CPC ......... *H10B 43/35* (2023.02); *H01L 21/0214* (2013.01); *H01L 21/28035* (2013.01); *H10D 30/0413* (2025.01)

(58) Field of Classification Search
CPC .... H10B 43/35; H10B 43/30; H10D 30/0413; H10D 30/69; H01L 21/0214
See application file for complete search history.

(56) References Cited

U.S. PATENT DOCUMENTS

2002/0020890 A1 2/2002 Willer

FOREIGN PATENT DOCUMENTS

| CN | 105321950 A | 2/2016 | |
|---|---|---|---|
| CN | 106298796 A | 1/2017 | |
| CN | 113782540 B * | 8/2023 | |
| CN | 111883537 B * | 10/2023 | .......... H01L 27/1157 |
| KR | 20050010554 A | 1/2005 | |
| KR | 20050055119 A | 6/2005 | |

OTHER PUBLICATIONS

Search Report from Korean Patent Office for Application No. 2022101496634 dated Dec. 26, 2024.

* cited by examiner

*Primary Examiner* — Christine S. Kim
*Assistant Examiner* — Andrew Victor Prostor
(74) *Attorney, Agent, or Firm* — Harris Beach Murtha Cullina PLLC

(57) ABSTRACT

An embedded SONOS memory and a method for making the same. The method includes: forming a connecting layer on one side of a selection transistor polysilicon gate; forming a second silicon oxide layer and an ONO charge storage layer on the other side of the selection transistor polysilicon gate far away from the connecting layer; then forming a memory transistor polysilicon gate on the side of the second silicon oxide layer far away from the connecting layer, so as to obtain the selection transistor polysilicon gate and the memory transistor polysilicon gate in a back-to-back structure.

9 Claims, 6 Drawing Sheets

EMBEDDED SONOS MEMORY AND METHOD OF MAKING THE SAME

CROSS-REFERENCE TO RELATED APPLICATIONS

This application claims priority to Chinese patent application No. CN 202210149663.4 filed at CNIPA on Feb. 18, 2022, and entitled "EMBEDDED SONOS MEMORY AND METHOD OF MAKING THE SAME", the disclosure of which is incorporated herein by reference in entirety.

TECHNICAL FIELD

The present application relates to the technical field of SONOS memory manufacturing, in particular to an embedded SONOS memory and a method for making the same.

BACKGROUND OF THE DISCLOSURE

As an essential storage device in computer, nonvolatile memory plays an important role in storing processed information. SONOS (Silicon-Oxide-Nitride-Oxide-Silicon) memory has the characteristics of small cell size, good data retention, low operating voltage, compatibility with CMOS process and the like.

The existing SONOS memory devices are usually SONOS devices in a two-transistor (selection transistor and memory transistor) separated structure, which needs to occupy too large chip design area. In addition, in the existing SONOS memory devices, the source end of the selection transistor and the gate of the selection transistor need to be connected to the peripheral circuit respectively, so that the external circuit design is more complicated.

SUMMARY

The present application provides an embedded SONOS memory and a method for making the same, which can solve at least one of the problems that the existing SONOS memory devices occupy too large chip design area and the external circuit design is more complicated.

In one aspect, the embodiment of the present application provides a method for making an embedded SONOS memory, which includes:
  providing a substrate, a first silicon oxide layer and a first silicon nitride layer being form on the substrate, a first trench being formed in the first silicon nitride layer, and two opposite selection transistor polysilicon gates covering side surfaces of the first silicon nitride layer being formed in the first trench;
  etching the first silicon oxide layer on a bottom wall of the first trench to a surface of the substrate;
  etching partial thickness of the substrate on the bottom wall of the first trench to obtain a second trench, and forming two connecting layers in the second trench, the connecting layers contacting the substrate on a bottom wall of the second trench and respectively covering one selection transistor polysilicon gate;
  forming an isolation oxide layer, the isolation oxide layer filling the second trench;
  removing the first silicon nitride layer and the first silicon oxide layer on the selection transistor polysilicon gate;
  forming a second silicon oxide layer, the second silicon oxide layer covering side surfaces of the selection transistor polysilicon gate;
  forming an ONO material layer, the ONO material layer covering the isolation oxide layer, the second silicon oxide layer and part of the surface of the substrate;
  forming a first polysilicon material layer, the first polysilicon material layer covering the ONO material layer;
  etching the first polysilicon material layer and the ONO material layer above the isolation oxide layer and the first polysilicon material layer and the ONO material layer on part of the substrate to obtain ONO charge storage layers and memory transistor polysilicon gates on the sides of the second silicon oxide layer; and
  forming a stacked logic oxide layer and a logic polysilicon gate on the surface of the substrate far away from the storage transistor polysilicon gate.

Exemplarily, in the method for making the embedded SONOS memory, a material of the connecting layer is polysilicon.

Exemplarily, in the method for making the embedded SONOS memory, the step of etching partial thickness of the substrate on the bottom wall of the first trench to obtain a second trench, and forming two connecting layers in the second trench, the connecting layers respectively covering one selection transistor polysilicon gate includes:
  forming a second polysilicon material layer, the second polysilicon material layer covering the first silicon nitride layer, the selection transistor polysilicon gate and the substrate on the bottom wall of the first trench;
  etching and removing the second polysilicon material layer on the first silicon nitride layer and the second polysilicon material layer on the bottom wall of the first trench to obtain the connecting layers; and
  etching partial thickness of the substrate on the bottom wall of the first trench to obtain the second trench.

Exemplarily, in the method for making the embedded SONOS memory, in the process of forming the stacked logic oxide layer and the logic polysilicon gate, the method for making the embedded SONOS memory further includes forming silicon oxide sidewalls, the silicon oxide sidewalls covering the side surfaces of the memory transistor polysilicon gates and the side surfaces of the ONO charge storage layers.

Exemplarily, in the method for making the embedded SONOS memory, in the process of etching partial thickness of the substrate on the bottom wall of the first trench to obtain the second trench, the etched partial thickness of the substrate is more than 1000 Å.

Exemplarily, in the method for making the embedded SONOS memory, in the second trench, the size of the isolation oxide layer in width is 500 Å-5000 Å.

Exemplarily, in the method for making the embedded SONOS memory, an active region is formed on the surface of the substrate at a bottom of each connecting layer, and each selection transistor polysilicon gate is electrically connected to the source region at the bottom of each connecting layer through the connecting layer.

Exemplarily, in the method for making the embedded SONOS memory, the thickness of the second silicon oxide layer is 100 Å-800 Å; the thickness of the ONO charge storage layer is 80 Å-200 Å.

Exemplarily, in the method for making the embedded SONOS memory, the ONO charge storage layer includes a stacked silicon oxide film layer, a silicon nitride film layer and a silicon oxide film layer.

In another aspect, the present application provides an embedded SONOS memory, which includes:
  a substrate, a patterned first silicon oxide layer being formed on the substrate;

two oppositely disposed selection transistor polysilicon gates, the selection transistor polysilicon gates covering the patterned first silicon oxide layer;

two connecting layers, the connecting layers respectively covering one selection transistor polysilicon gate and contacting the substrate, a second trench being formed between the connecting layer and partial thickness of the substrate;

an isolation oxide layer, the isolation oxide layer filling the second trench;

a second silicon oxide layer, the second silicon oxide layer covering side surfaces of the selection transistor polysilicon gate;

two ONO charge storage layers, the ONO charge storage layers being respectively located on sides of the second silicon oxide layer and covering the side surfaces of the second silicon oxide layer and part of the surface of the substrate;

two memory transistor polysilicon gates, the memory transistor polysilicon gates covering the ONO charge storage layers; and a stacked logic oxide layer and a logic polysilicon gate, the logic oxide layer and the logic polysilicon gate being located on the surface of the substrate far away from the memory transistor polysilicon gates.

The technical solution of the present application at least has the following advantages:

By forming the selection transistor polysilicon gate and the memory transistor polysilicon gate in the back-to-back structure, the present application saves the chip design area compared with the traditional two-transistor separated SONOS device.

Further, by using the connecting layer, the gate of the selection transistor polysilicon gate can be connected to the corresponding source end in the substrate, and then they can be connected to the same selection transistor word line, so that the external circuit design can be more concise.

In addition, the present application uses the first silicon nitride layer as a hard mask to define the width of the selection transistor polysilicon gate and the memory transistor polysilicon gate in adjacent SONOS memory devices on the whole wafer, and uses the polysilicon gate self-aligned etching method to define the width of the single selection gate and the single memory gate in each SONOS memory device. Under the condition of limited lithography ability, it can be used for manufacturing smaller SONOS memories.

BRIEF DESCRIPTION OF THE DRAWINGS

In order to more clearly describe the specific embodiments of the present application or the technical solution in the prior art, the drawings needed to be used in the description of the specific embodiments or the prior art will be briefly introduced below. It is obvious that the drawings in the following description are some embodiments of the present application. For those skilled in the art, other drawings can be obtained according to these drawings without contributing any inventive labor.

DESCRIPTION OF REFERENCE SIGNS

Figure 1:
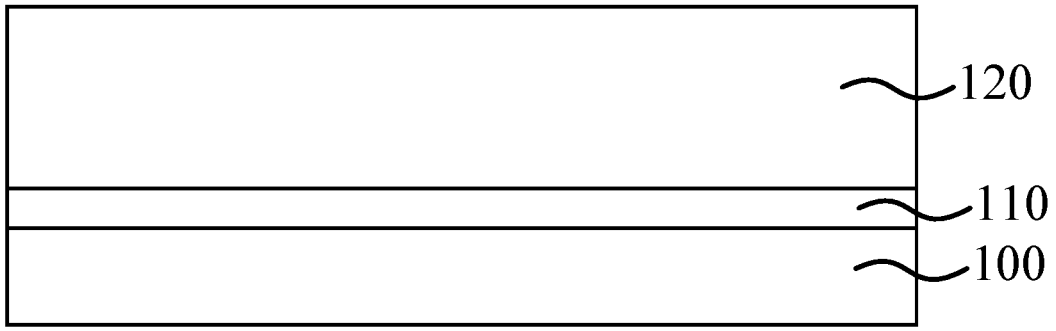
FIGS. 1 to 16 illustrate schematic diagrams of semiconductor structures in each process step of making an embedded SONOS memory according to an embodiment of the present application.

100—substrate, 110—first silicon oxide layer, 111—patterned first silicon oxide layer, 120—first silicon nitride layer, 121—first trench, 122—second trench, 130—polysilicon material layer, 131—selection transistor polysilicon gate, 140—second polysilicon material layer, 141—connecting layer, 150—isolation oxide layer, 160—silicon oxide material layer, 161—second silicon oxide layer, 170—ONO material layer, 171—ONO charge storage layer, 180—first polysilicon material layer, 181—memory transistor polysilicon gate, 190—silicon oxide material layer, 191—silicon oxide sidewall, 192—logic oxide layer, 200—polysilicon material layer, 201—logic polysilicon gate.

DETAILED DESCRIPTION OF THE DISCLOSURE

The technical solution in the present application will be clearly and completely described below with reference to the drawings. Obviously, the described embodiments are part of the embodiments of the present application, not all of them. Based on the embodiments in the present application, all other embodiments obtained by those skilled in the art without contributing any inventive labor still fall within the scope of protection of the present application.

In the description of the present application, it should be noted that the orientation or position relationship indicated by the terms "center", "up", "down", "left", "right", "vertical", "horizontal", "inside", "outside" and so on is based on the orientation or position relationship illustrated in the drawings, only for the convenience of describing the present application and simplifying the description, rather than indicating or implying that the device or element referred to must have a specific orientation or be constructed and operated in a specific orientation, so it cannot be understood as a limitation to the present application. In addition, the terms "first", "second" and "third" are used only for descriptive purposes and cannot be understood as indicating or implying relative importance.

In the description of the present application, it should be noted that unless otherwise clearly specified and limited, the terms "mount", "connected" and "connecting" should be understood in a broad sense. For example, it may be fixed connection, removable connection or integrated connection; it may be mechanical connection or electrical connection; it may be direct connection, indirect connection through an intermediate medium, internal communication of two components, wireless connection or wired connection. For those skilled in the art, the specific meanings of the above terms in the present application can be understood in specific circumstances.

In addition, the technical features involved in different embodiments of the present application described below may be combined with each other as long as they do not constitute a conflict with each other.

The embodiment of the present application provides a method for making an embedded SONOS memory. Specifically, please refer to FIGS. 1 to 16, which illustrates schematic diagrams of semiconductor structures in each process step of making an embedded SONOS memory according to an embodiment of the present application. Next, the method for making the embedded SONOS memory will be described below in detail.

Figure 2:
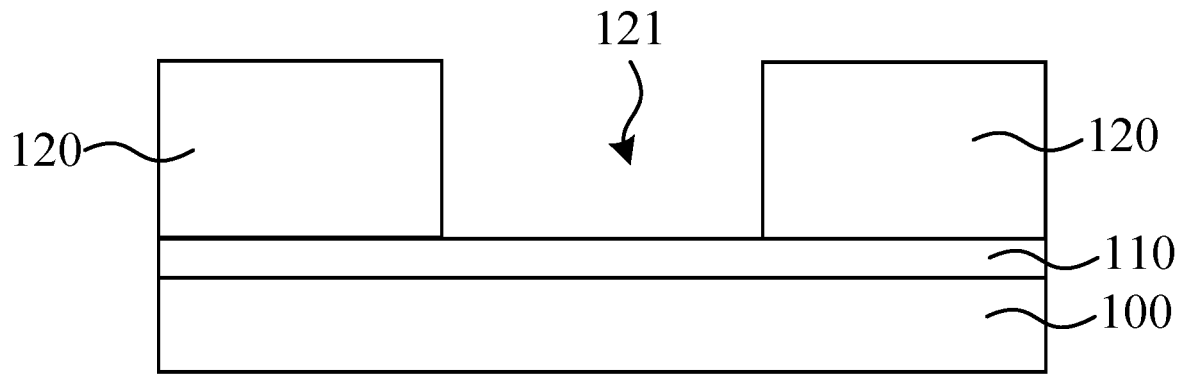
Figure 4:
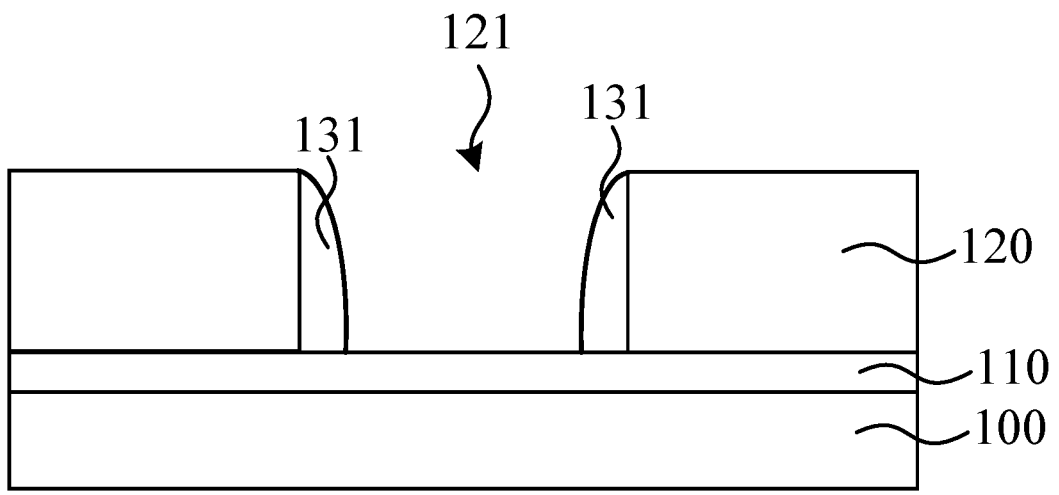

Firstly, referring to FIG. 1, a substrate 100 is provided. A first silicon oxide layer 110 and a first silicon nitride layer 120 are formed on the substrate 100. Referring to FIG. 2, a first trench 121 is formed in the first silicon nitride layer 120. Referring to FIG. 4, two opposite selection transistor polysilicon gates 131 covering the side surfaces of the first silicon nitride layer 120 are formed in the first trench 121.

Figure 3:
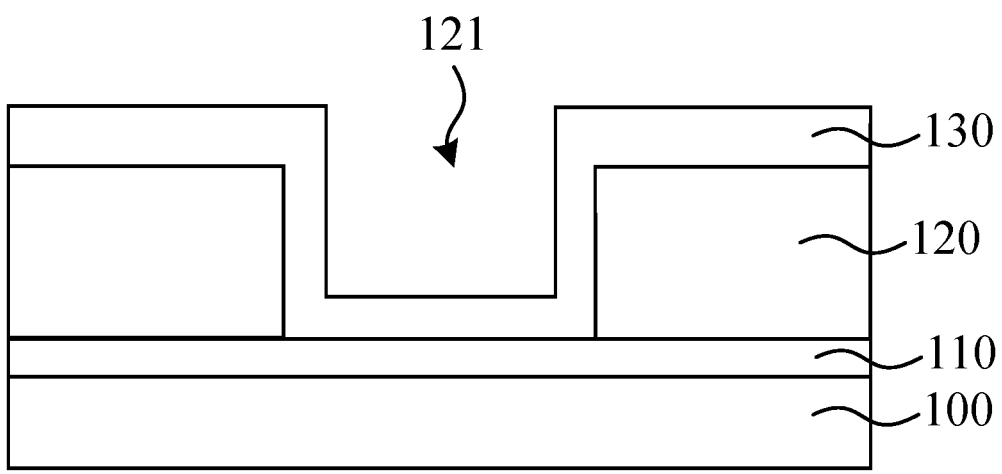

Specifically, the step of forming the selection transistor polysilicon gates 131 may include: referring to FIG. 3, firstly depositing a polysilicon material layer 130 after forming the first trench 121, wherein the polysilicon material layer 130 covers the first silicon nitride layer 120 and the sidewalls and bottom wall of the first trench 121; referring to FIG. 4, then removing the polysilicon material layer 130 on the first silicon nitride layer 120 and the polysilicon material layer 130 on the bottom wall of the first trench 121; and finally reserving the polysilicon material layer 130 covering the side surfaces of the first silicon nitride layer 120 in the first trench 121 to obtain two opposite selection transistor polysilicon gates 131.

Figure 5:
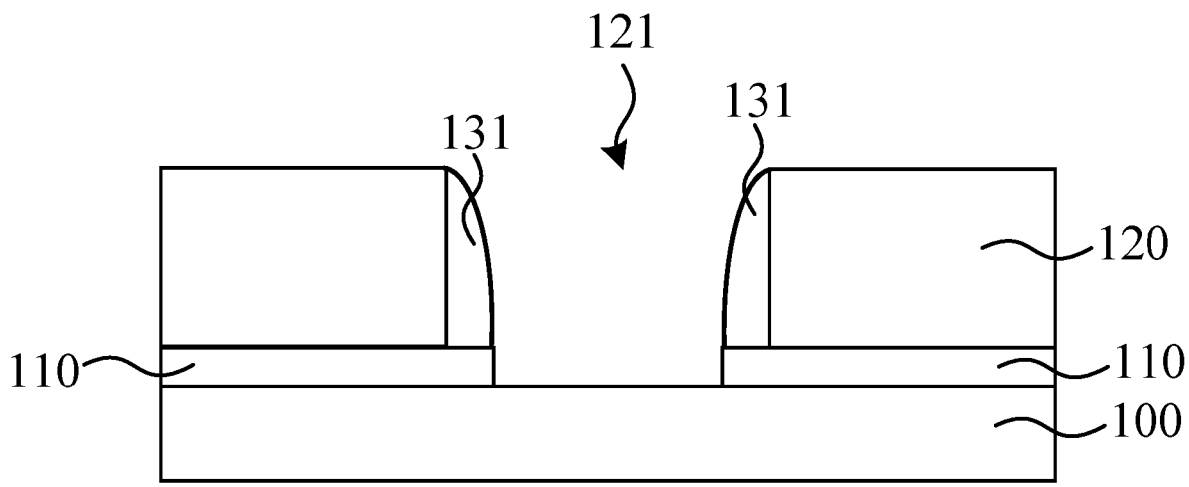
Figure 6:
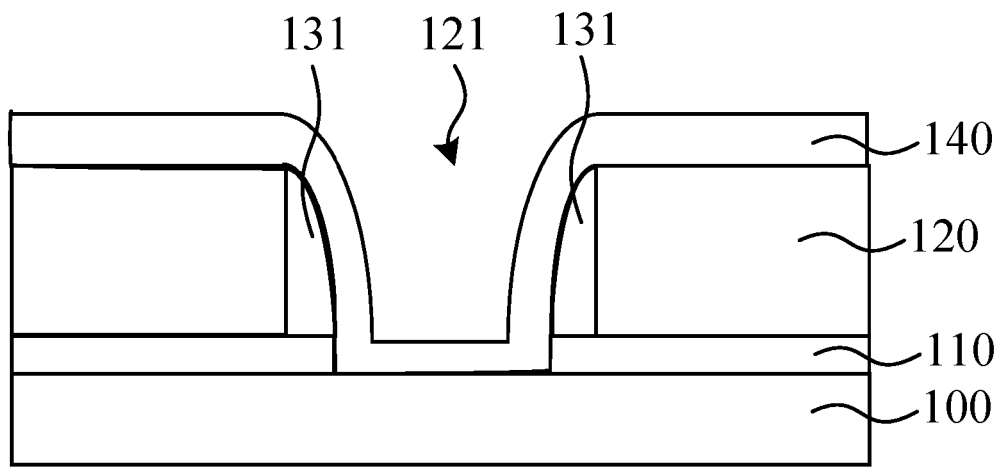
Figure 7:
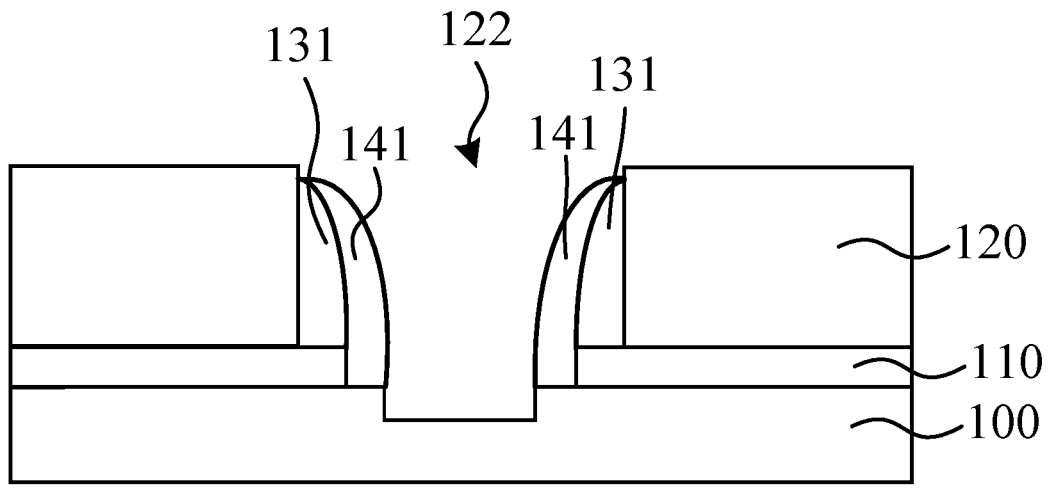

Then, referring to FIG. 5, the first silicon oxide layer 110 on the bottom wall of the first trench 121 is etched to expose the surface of the substrate 100.

Then, partial thickness of the substrate 100 on the bottom wall of the first trench 121 is etched to obtain a second trench 122, and two connecting layers 141 are formed in the second trench 122. The connecting layers 141 contact the substrate 100 on the bottom wall of the second trench 122 and respectively cover one selection transistor polysilicon gate 131. A material of the connecting layer 141 is polysilicon. Specifically, the steps of obtaining the second trench 122 and forming two connecting layers 141 may include: step 1: referring to FIG. 6, forming a second polysilicon material layer 140, wherein second polysilicon material layer 140 covers the first silicon nitride layer 120, the selection transistor polysilicon gate 131 and the substrate 100 on the bottom wall of the first trench 121; step 2: referring to FIG. 7, etching and removing the second polysilicon material layer 140 on the first silicon nitride layer 120 and the second polysilicon material layer 140 on the bottom wall of the first trench 121 to obtain the connecting layers 141; step 3: referring to FIG. 7, etching partial thickness of the substrate 100 on the bottom wall of the first trench 121 to obtain the second trench 122.

Figure 8:
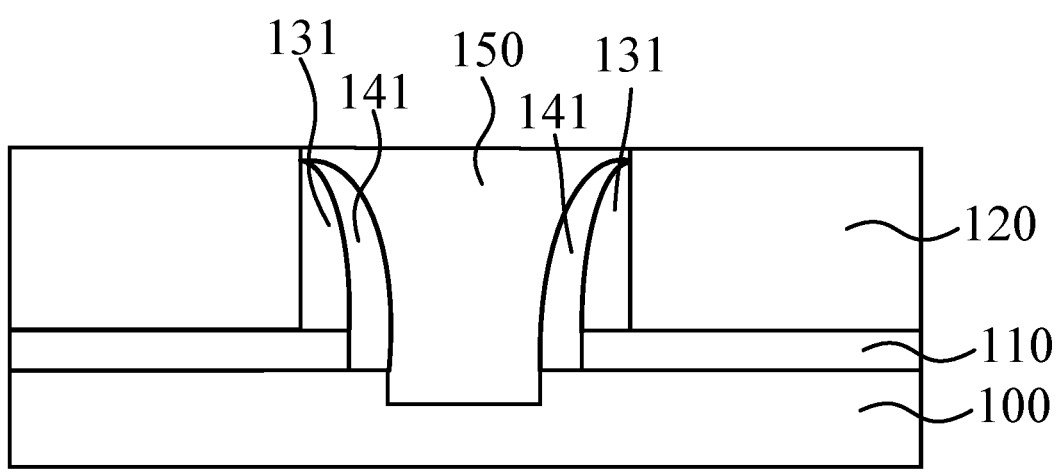

Further, referring to FIG. 8, an isolation oxide layer 150 is formed. The isolation oxide layer 150 fills the second trench 122. Specifically, in the second trench 122, the size of the isolation oxide layer 150 in width may be 500 Å-5000 Å.

In this embodiment, an active region (not shown) is formed on the surface of the substrate 100 at the bottom of each connecting layer 141. Each selection transistor polysilicon gate 131 is electrically connected to the source region at the bottom of each connecting layer 141 through the connecting layer 141. By using the connecting layers 141, the gate of the selection transistor polysilicon gate 131 can be connected to the corresponding source end in the substrate 100, then which can be connected to the same selection transistor word line, thus making the external circuit design of the memory device more concise.

Further, in the process of etching partial thickness of the substrate 100 on the bottom wall of the first trench 121 to obtain the second trench 122, it is necessary to etch more than 1000 Å of the substrate 100, so that the isolation oxide layer 150 filled in the second trench 122 can well isolate the source regions on both sides.

Figure 9:
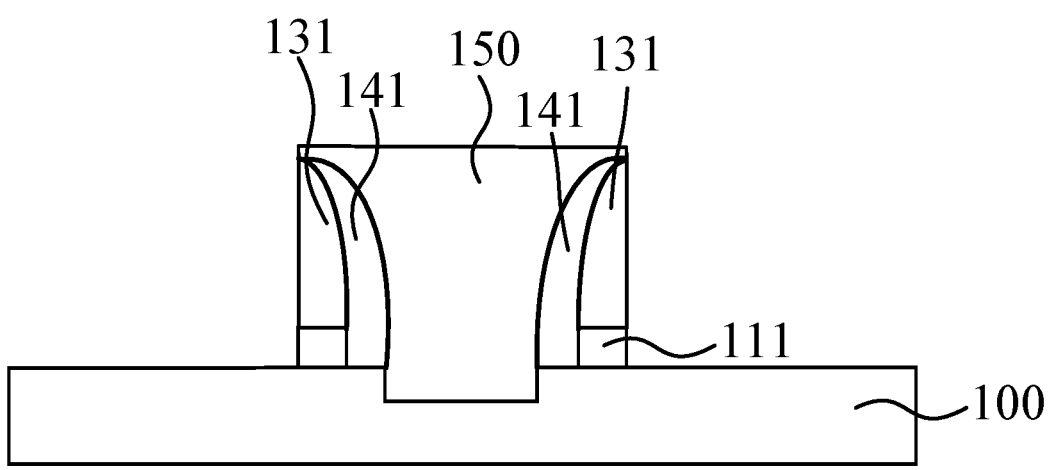
Figure 10:
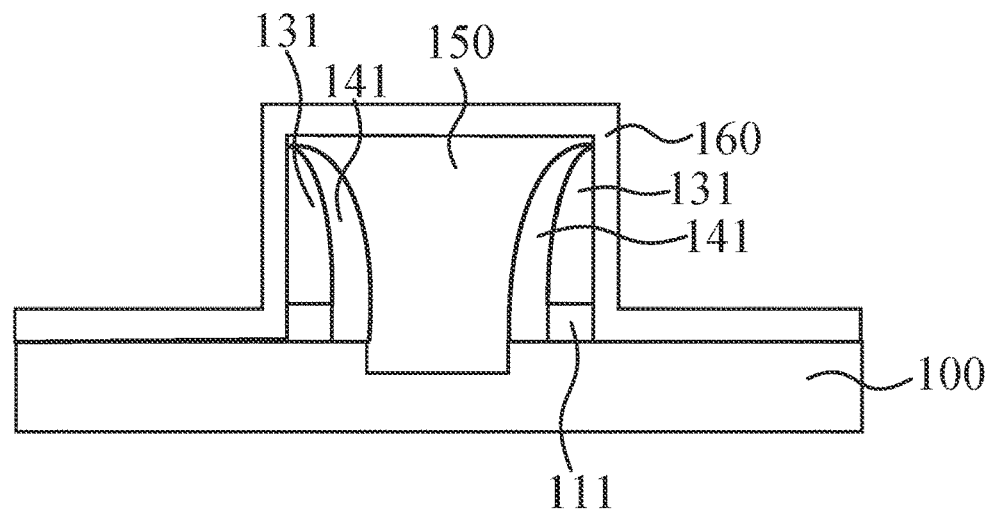
Figure 11:
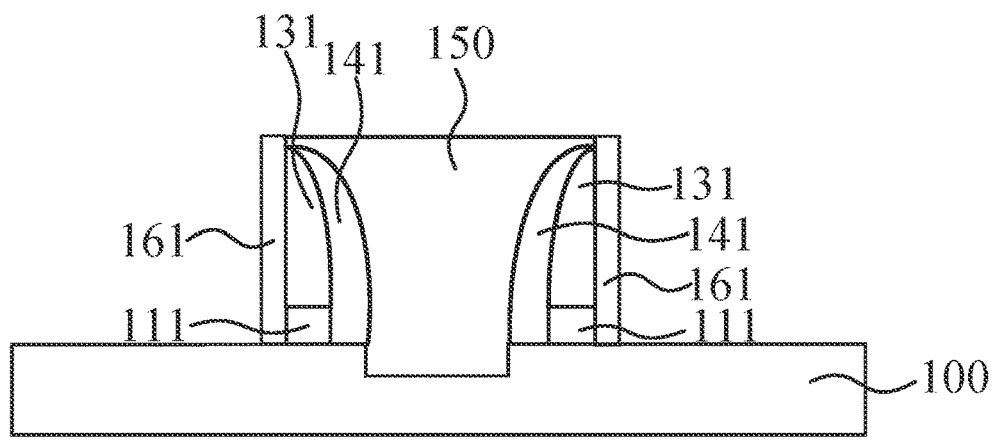

Then, referring to FIG. 9, the first silicon nitride layer 120 and the first silicon oxide layer 110 on the side of the selection transistor polysilicon gate 131 are removed to obtain a patterned first silicon oxide layer 111 (the remaining first silicon oxide layer 110) at the bottom of the selection transistor polysilicon gate 131.

Further, a second silicon oxide layer 161 is formed. The second silicon oxide layer 161 covers the side surface of the selection transistor polysilicon gate 131. Specifically, the step of forming the second silicon oxide layer 161 may include: firstly, referring to FIG. 10, forming a silicon oxide material layer 160, wherein the silicon oxide material layer 160 covers the isolation oxide layer 150, the side surfaces of the selection transistor polysilicon gate 131 and the surface of the substrate 100; then, referring to FIG. 11, in this embodiment, since the etching process of the isolation oxide layer 160 is a dry etching process without a mask, etching off the silicon oxide material layer 160 on the surfaces of the substrate 100 and the isolation oxide layer 150, that is, etching and removing the silicon oxide material layer 160 on the surface of the substrate 100 and the surface of the isolation oxide layer 150 to obtain the final second silicon oxide layer 161 covering the side surfaces of the selection transistor polysilicon gate 131.

Figure 12:
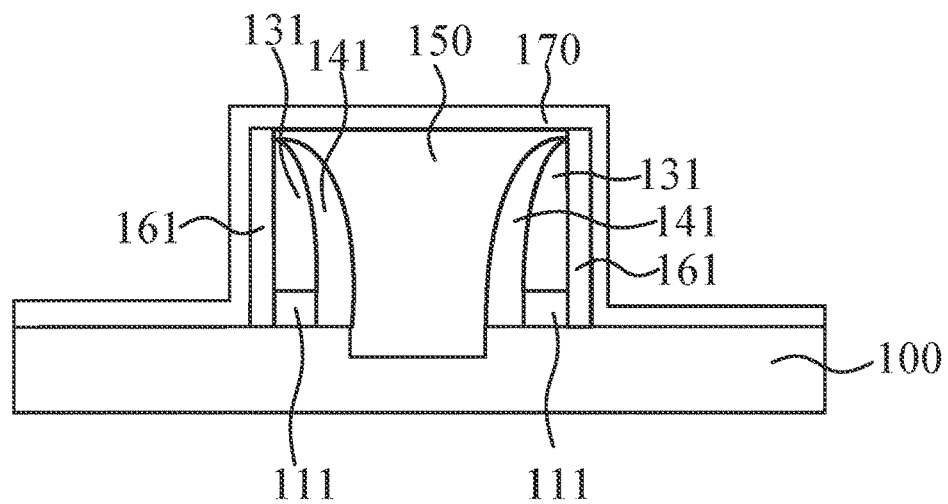

Then, referring to FIG. 12, an ONO material layer 170 is formed. The ONO material layer 170 covers the second silicon oxide layer 161, the isolation oxide layer 150 and part of the surface of the substrate 100.

Figure 13:
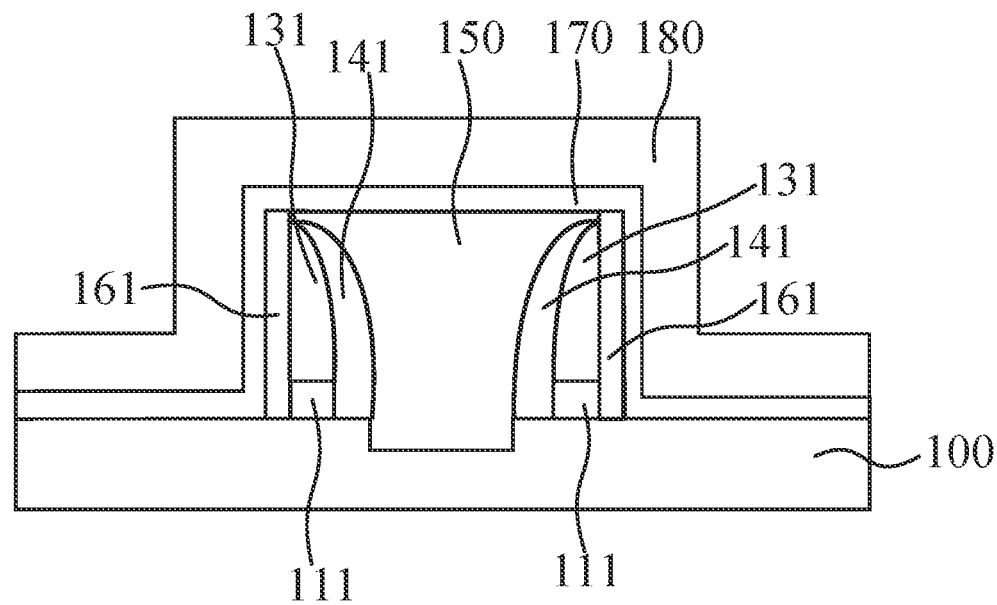

Further, referring to FIG. 13, a first polysilicon material layer 180 is formed. The first polysilicon material layer 180 covers the ONO material layer 170.

Figure 14:
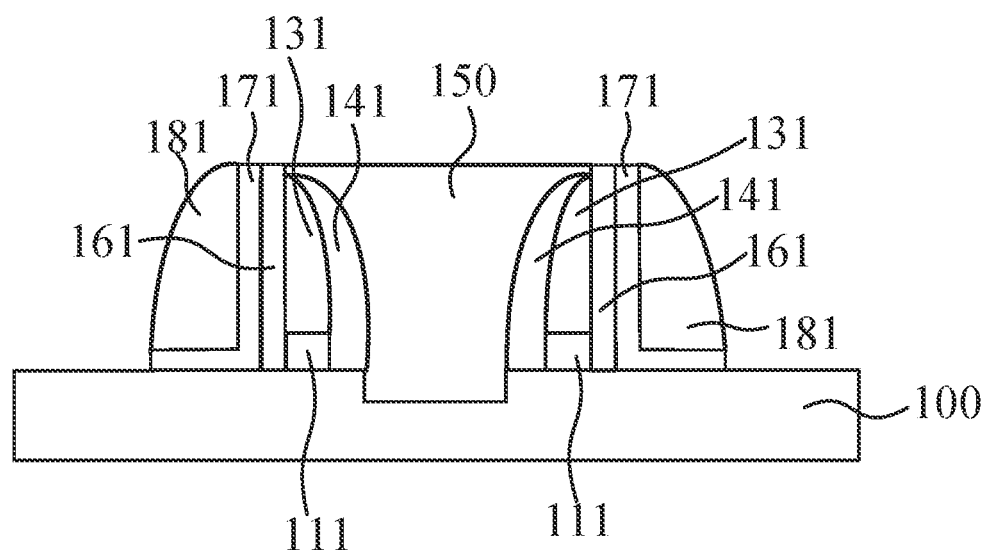
Figure 15:
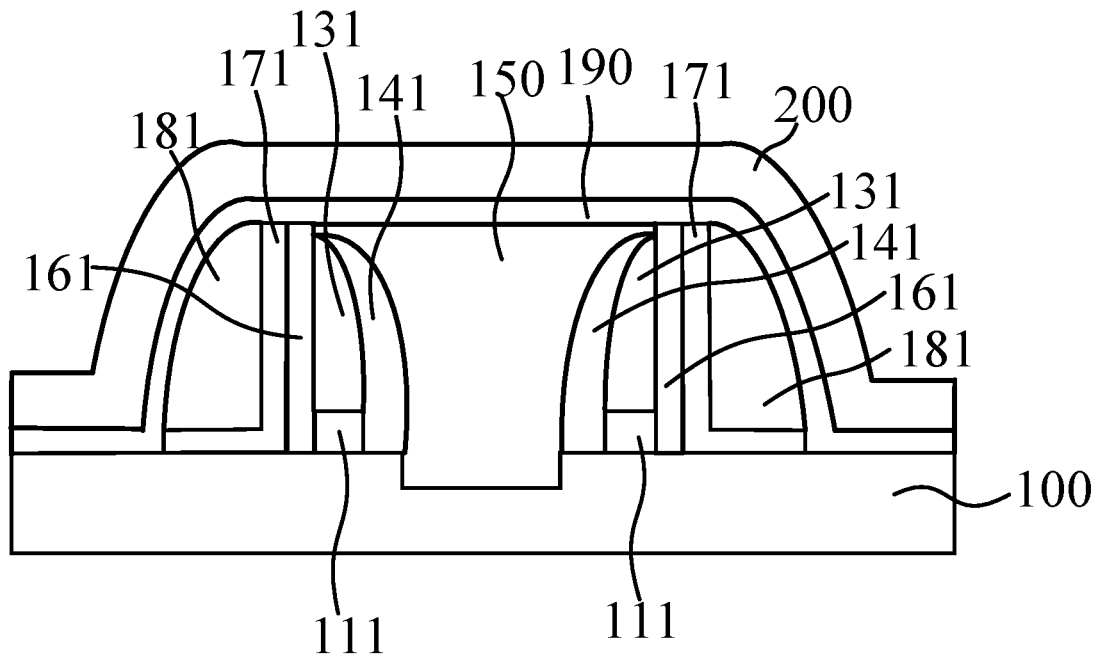

Further, referring to FIG. 14, the first polysilicon material layer 180 and the ONO material layer 170 above the isolation oxide layer 150 and the first polysilicon material layer 180 and the ONO material layer 170 on part of the substrate 100 are etched to obtain two ONO charge storage layers 171 and two memory transistor polysilicon gates 181 on the sides of the two second silicon oxide layers 161, respectively. Specifically, the thickness of the second silicon oxide layer 161 may be 100 Å-800 Å. The thickness of the ONO charge storage layer 171 may be 80 Å-200 Å. Further, the ONO charge storage layer 171 may include a stacked silicon oxide film layer, a silicon nitride film layer and a silicon oxide film layer. As can be seen from FIG. 14, the cross section of the ONO charge storage layer 171 is L-shaped. In this embodiment, the selection transistor polysilicon gate 131, the memory transistor polysilicon gate 181 and other related film layers on the left side of the isolation oxide layer 150 form a storage cell. Similarly, the selection transistor polysilicon gate 131, the memory transistor polysilicon gate 181 and other related film layers on the right side of the isolation oxide layer 150 also form a storage cell. Accordingly, the embedded SONOS memory provided in this embodiment is equivalent to an array memory device of 2 rows*1 column. Several embedded SONOS memories provided in this embodiment can be formed on the whole wafer to form an array memory device of M rows*N columns.

In this embodiment, the present application uses the first silicon nitride layer 120 as a hard mask to define the width of the selection transistor polysilicon gate and the memory transistor polysilicon gate in the adjacent SONOS memory devices on the whole wafer, and uses the polysilicon gate self-aligned etching method to define the width of the single selection transistor polysilicon gate 131 and the single memory transistor polysilicon gate 181 in each SONOS memory device. Under the condition of limited lithography ability, it can be used for manufacturing smaller SONOS memories.

Further, in this embodiment, the present application forms the selection transistor polysilicon gate 131 and the memory transistor polysilicon gate 181 in a back-to-back structure, and the selection transistor polysilicon gate 131 and the memory transistor polysilicon gate 181 are isolated by the second silicon oxide layer 161 and the ONO charge storage layer 171, so that the chip design area is saved compared with the traditional two-transistor separated SONOS device. Accordingly, it can be seen that the embedded SONOS memory provided by this embodiment can save the chip design area while the performance is not influenced.

Finally, a stacked logic oxide layer 192 and a logic polysilicon gate 201 are formed on the surface of the substrate 100 far away from the storage area (the memory transistor polysilicon gate 181). Specifically, the step of forming the logic oxide layer 192 and the logic polysilicon gate 201 may include: firstly, referring to FIG. 15, forming a silicon oxide material layer 190, wherein the silicon oxide material layer 190 covers the second silicon oxide layer 161, the isolation oxide layer 150, the memory transistor polysilicon gate 181 and part of the substrate 100; then forming a polysilicon material layer 200, wherein the polysilicon material layer 200 covers the silicon oxide material layer 190; then, etching and removing the polysilicon material layer 200 and the silicon oxide material layer 190 above the isolation oxide layer 150 and the polysilicon material layer 200 and the silicon oxide material layer 190 on the surface of part of the substrate 100 to form silicon oxide sidewalls 191 covering the side surfaces of the memory transistor polysilicon gate 181 and the side surfaces of the ONO charge storage layer 171, and a stacked logic oxide layer 192 and a logic polysilicon gate 201, wherein the logic oxide layer 192 and the logic polysilicon gate 201 are structures of the logic region.

Figure 16:
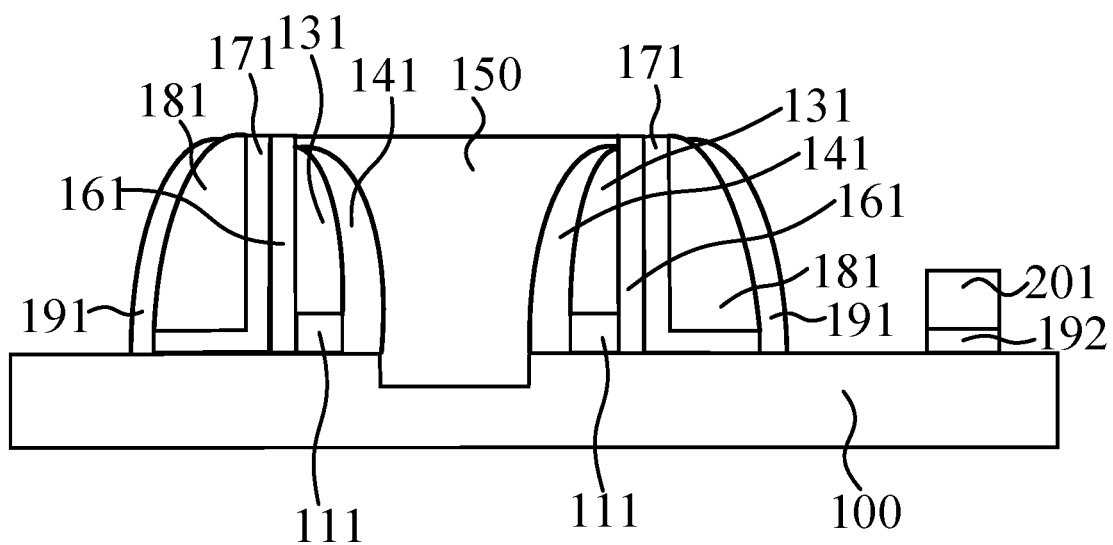

Based on the same concept, the embodiment of the present application further provides an embedded SONOS memory. Referring to FIG. 16, the embedded SONOS memory includes:

a substrate 100, the substrate 100 including a storage region and a logic region, wherein a patterned first silicon oxide layer 111 is formed on the substrate 100;

two oppositely disposed selection transistor polysilicon gates 131, the selection transistor polysilicon gates 131 covering the patterned first silicon oxide layer 111;

two connecting layers 141, the connecting layers 141 respectively covering one selection transistor polysilicon gate 131 and contacting the substrate 100, a second trench 122 being formed between the connecting layer 141 and partial thickness of the substrate 100;

an isolation oxide layer 150, the isolation oxide layer 150 filling the second trench 122;

a second silicon oxide layer 161, the second silicon oxide layer 161 covering side surfaces of the selection transistor polysilicon gate 131;

two ONO charge storage layers 171, the ONO charge storage layers 171 being respectively located on sides of the second silicon oxide layer 161 and covering the side surfaces of the second silicon oxide layer 161 and part of the surface of the substrate 100;

two memory transistor polysilicon gates 181, the memory transistor polysilicon gates 181 covering the ONO charge storage layers 171; and a stacked logic oxide layer 192 and a logic polysilicon gate 201, the logic oxide layer 192 and the logic polysilicon gate 201 being located on the surface of the substrate 100 far away from the storage region.

In this embodiment, the patterned first silicon oxide layer 111, the selection transistor polysilicon gates 131, the connection layers 141, the isolation oxide layer 150, the second silicon oxide layer 161, the ONO charge storage layers 171 and the memory transistor polysilicon gates 181 are all located in the storage region; the logic oxide layer 192 and the logic polysilicon gate 201 are located in the logic region.

Obviously, the above embodiment is only an example for clear description, instead of a limitation to the embodiment. For those skilled in the art, other changes or variations in different forms may be made on the basis of the above description. It is unnecessary and impossible to enumerate all the embodiments here. Obvious changes or variations derived therefrom still fall within the scope of protection of the present application.

What is claimed is:

1. A method for making an embedded SONOS memory, wherein the method comprises:

providing a substrate, a first silicon oxide layer and a first silicon nitride layer being form on the substrate, a first trench being formed in the first silicon nitride layer, and two opposite selection transistor polysilicon gates covering side surfaces of the first silicon nitride layer being formed in the first trench;

etching the first silicon oxide layer on a bottom wall of the first trench to a surface of the substrate;

etching partial thickness of the substrate on the bottom wall of the first trench to obtain a second trench, and forming two connecting layers in the second trench, the connecting layers contacting the substrate on a bottom wall of the second trench and respectively covering one selection transistor polysilicon gate;

forming an isolation oxide layer, the isolation oxide layer filling the second trench;

removing the first silicon nitride layer and the first silicon oxide layer on the selection transistor polysilicon gate;

forming a second silicon oxide layer, the second silicon oxide layer covering side surfaces of the selection transistor polysilicon gate;

forming an ONO material layer, the ONO material layer covering the isolation oxide layer, the second silicon oxide layer and part of the surface of the substrate;

forming a first polysilicon material layer, the first polysilicon material layer covering the ONO material layer;

etching the first polysilicon material layer and the ONO material layer above the isolation oxide layer and the first polysilicon material layer and the ONO material layer on part of the substrate to obtain ONO charge storage layers and memory transistor polysilicon gates on the sides of the second silicon oxide layer; and forming a stacked logic oxide layer and a logic polysilicon gate on the surface of the substrate far away from the memory transistor polysilicon gate.

2. The method for making the embedded SONOS memory according to claim 1, wherein a material of the connecting layer is polysilicon.

3. The method for making the embedded SONOS memory according to claim 2, wherein the step of etching partial thickness of the substrate on the bottom wall of the first trench to obtain a second trench, and forming two connecting layers in the second trench, the connecting layers respectively covering one selection transistor polysilicon gate comprises:

forming a second polysilicon material layer, the second polysilicon material layer covering the first silicon nitride layer, the selection transistor polysilicon gate and the substrate on the bottom wall of the first trench;

etching and removing the second polysilicon material layer on the first silicon nitride layer and the second polysilicon material layer on the bottom wall of the first trench to obtain the connecting layers; and etching partial thickness of the substrate on the bottom wall of the first trench to obtain the second trench.

4. The method for making the embedded SONOS memory according to claim 1, wherein in the process of forming the stacked logic oxide layer and the logic polysilicon gate, the method for making the embedded SONOS memory further comprises forming silicon oxide sidewalls, the silicon oxide sidewalls covering the side surfaces of the memory transistor polysilicon gates and the side surfaces of the ONO charge storage layers.

5. The method for making the embedded SONOS memory according to claim 1, wherein in the process of etching partial thickness of the substrate on the bottom wall of the first trench to obtain the second trench, the etched partial thickness of the substrate is more than 1000 Å.

6. The method for making the embedded SONOS memory according to claim 1, wherein in the second trench, the size of the isolation oxide layer in width is 500 Å-5000 Å.

7. The method for making the embedded SONOS memory according to claim 1, wherein an active region is formed on the surface of the substrate at a bottom of each connecting layer, and each selection transistor polysilicon gate is electrically connected to the source region at the bottom of each connecting layer through the connecting layer.

8. The method for making the embedded SONOS memory according to claim 1, wherein the thickness of the second silicon oxide layer is 100 Å-800 Å; the thickness of the ONO charge storage layer is 80 Å-200 Å.

9. The method for making the embedded SONOS memory according to claim 1, wherein the ONO charge storage layer comprises a stacked silicon oxide film layer, a silicon nitride film layer and a silicon oxide film layer.

* * * * *